United States Patent [19]

Sano et al.

[11] Patent Number: 4,525,637
[45] Date of Patent: Jun. 25, 1985

[54] INTEGRATED CIRCUIT HAVING AN INPUT VOLTAGE-CLAMPING FUNCTION AND AN INPUT CURRENT-DETECTING FUNCTION

[75] Inventors: Yoshiaki Sano, Kawasaki; Chikara Tsuchiya; Osamu Maida, both of Tokyo, all of Japan

[73] Assignees: Fujitsu Limited, Kawasaki; Nippon Kogaku K.K., Tokyo, both of Japan

[21] Appl. No.: 425,654

[22] Filed: Sep. 28, 1982

[30] Foreign Application Priority Data

Sep. 29, 1981 [JP] Japan ................. 56-152871

[51] Int. Cl.³ .................. H03K 5/08; H03K 5/153
[52] U.S. Cl. ................... 307/350; 307/362; 307/557; 307/562; 307/303
[58] Field of Search ............. 307/350, 362, 363, 557, 307/562, 303

[56] References Cited

U.S. PATENT DOCUMENTS 3,979,606 9/1976 Ahmed ...................... 307/362
4,104,547 8/1978 Frederiksen et al. ............. 307/362

Primary Examiner—John Zazworsky
Attorney, Agent, or Firm—Staas & Halsey

[57] ABSTRACT

An integrated circuit has an input voltage-clamping function and an input current-detecting function. A voltage-clamping circuit is provided for clamping a voltage at the input signal terminal, the voltage being clamped in response to an input current greater than a first predetermined value supplied to the input terminal. A current detecting circuit is also provided for detecting whether the input current supplied to the input terminal is greater than a second predetermined value, whereby the single input terminal for signals is used for both functions, i.e., the input voltage-clamping function and the input current-detecting function.

12 Claims, 6 Drawing Figures

Fig. 2A
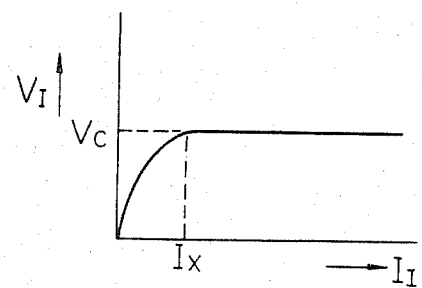
Fig. 2B
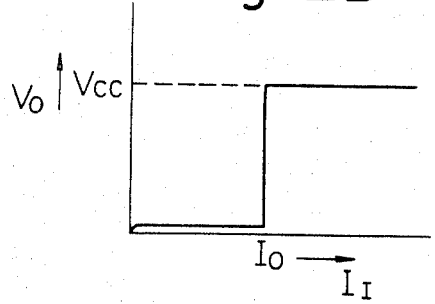
Fig. 3
Fig. 5
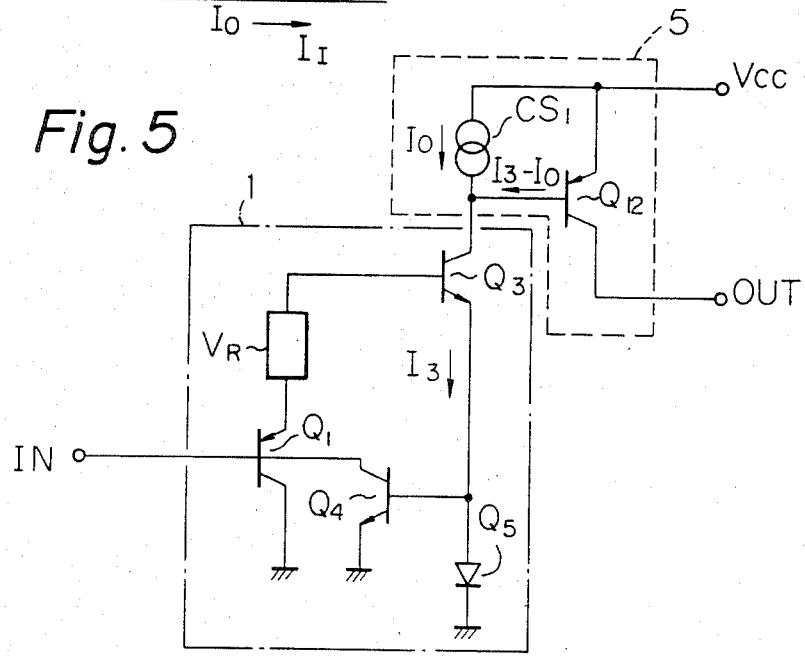

INTEGRATED CIRCUIT HAVING AN INPUT VOLTAGE-CLAMPING FUNCTION AND AN INPUT CURRENT-DETECTING FUNCTION

BACKGROUND OF THE INVENTION

1. Field of the Invention

The present invention relates to an integrated circuit. More particularly, it relates to an integrated circuit having a limited number of I/0 terminals wherein two different functions are given to one of the I/0 terminals by providing a simple circuit configuration. The circuit of the present invention is used, for example, as an input stage of an integrated logic circuit for driving a strobe light or an electronic flash unit used with a camera.

2. Description of the Prior Art

In accordance with a recent increase in the degree of integration of an integrated circuit, the number of I/0 terminals for an integrated circuit chip has been increased. However, in order to mount the chip on a package, it is desired that the number of terminals be as few as possible. Therefore, it is necessary, in an integrated circuit, that one terminal have a plurality of functions. It is necessary especially in a circuit for connecting a camera to a strobe light unit mounted thereon because an increase of the number of terminals for connecting the camera to the strobe light unit is not preferable in view of the space.

SUMMARY OF THE INVENTION

It is, therefore, a primary object of the present invention to provide one terminal of an integrated circuit having a plurality of functions, by providing a simple circuit in the integrated circuit.

Another object of the present invention is to provide one terminal of an integrated circuit having both the function of clamping the input voltage and the function of detecting the input current.

In order to achieve the above objects, there is provided an integrated circuit having an input voltage-clamping function and an input current-detecting function, comprising: a signal input terminal for input signals; an output terminal; a voltage-clamping circuit, connected to the input terminal, for clamping a voltage at the input terminal, the voltage being clamped while an input current supplied to the input terminal is greater than a first predetermined value; a current-detecting circuit, connected to the voltage-clamping circuit, for detecting that the input current supplied to the input terminal is greater than a second predetermined value and for providing a detection signal; and an output circuit, connected between the current-detecting circuit and the output terminal, for providing an output signal at the output terminal in response to the detection signal.

BRIEF DESCRIPTION OF THE DRAWINGS

The above objects and advantages, as well as other features, of the present invention will be better understood from the following description of the preferred embodiments with reference to the accompanying drawings, wherein:

FIG. 2A is a graph illustrating of the input current-input voltage characteristic of the circuit of FIG. 1;

FIG. 2B is a graph of the input current-output voltage characteristic of the circuit of FIG. 1;

FIG. 3 is a circuit diagram of a reference voltage source which may alternatively be used in the circuit of FIG. 1, according to a second embodiment of the present invention; and FIGS. 4 and 5 are circuit diagrams illustrating of input stages of integrated circuits according to a third embodiment and a fourth embodiment of the present invention, respectively.

DESCRIPTION OF THE PREFERRED EMBODIMENTS

Figure 1:
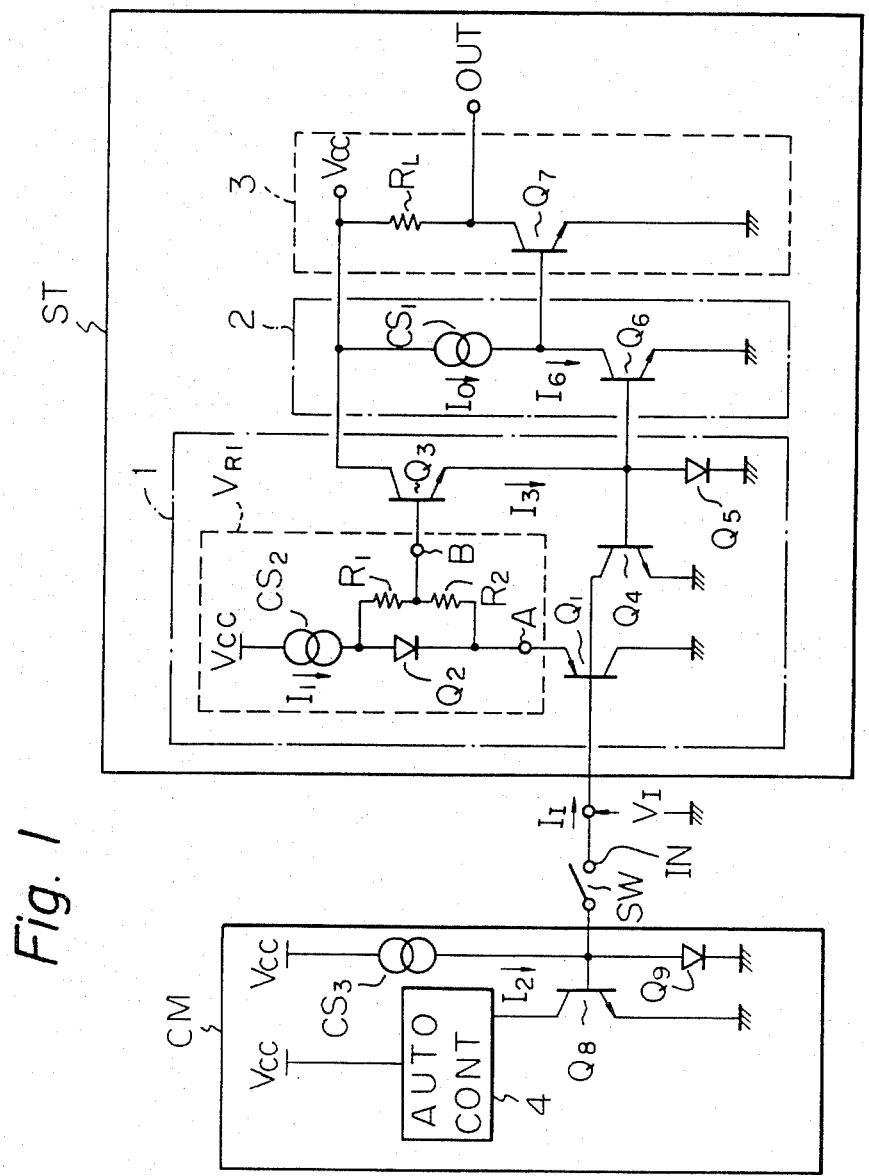
FIG. 1 is a circuit diagram illustrating of a camera system including an input stage of an integrated circuit according to a first embodiment of the present invention.

FIG. 1 is a camera system for explaining a first embodiment of the present invention. In FIG. 1, ST is an input stage of an integrated circuit in a strobe light unit, namely an electronic flash unit; and CM is a camera including an automatic shutter-control circuit which controls shutter speed in accordance with the brightness of an object to be photographed. The input stage ST comprises a voltage-clamping circuit 1 connected to an input terminal IN, a current-detecting circuit 2, and an output circuit 3. The voltage-clamping circuit 1 functions to clamp the input voltage to a predetermined voltage. It comprises a PNP transistor $Q_1$, a first NPN transistor $Q_3$, a reference voltage source $V_{R1}$, a second NPN transistor $Q_4$, and a diode $Q_5$. The PNP transistor $Q_1$ has a base connected to the input terminal IN, an emitter connected to a negative terminal A of the reference voltage source $V_{R1}$, and a collector connected to ground. The first NPN transistor $Q_3$ has a base connected to a positive terminal B of the reference voltage source $V_{R1}$, a collector connected to a power supply line $V_{CC}$, and an emitter. The second NPN transistor $Q_4$ has a base connected to the emitter of the first NPN transistor $Q_3$, a collector connected to the input terminal IN, and an emitter connected to ground. The diode $Q_5$ has an anode connected to the emitter of the first transistor $Q_3$ and a cathode connected to ground.

The current-detecting circuit 2 functions to compare an emitter current $I_3$ of the first NPN transistor $Q_3$ with a reference current $I_0$. It comprises a third NPN transistor $Q_6$ and a first current source $CS_1$ for supplying the constant current $I_0$ and connected between the collector of the third NPN transistor $Q_6$ and the power supply line $V_{CC}$. The base of the third NPN transistor $Q_6$ is commonly connected to the emitter of the transistor $Q_3$, the base of the transistor $Q_4$, and the anode of the diode $Q_5$. The emitter of the transistor $Q_6$ is grounded.

The output circuit 3 comprises a fourth NPN transistor $Q_7$ having a base connected to the collector of the third NPN transistor $Q_6$, an emitter connected to the ground, and a collector connected to an output terminal OUT. The collector of the transistor $Q_7$ is connected through a load resistor $R_L$ to the power supply line $V_{CC}$.

The diode $Q_5$ is obtained, for example, by short circuiting a base and a collector of an NPN transistor, wherein the base is the anode and the emitter is the cathode.

The reference voltage source $V_{R1}$ comprises a second current source $CS_2$ for supplying a constant current $I_1$, a second diode $Q_2$ connected in series with the current source $CS_2$, and resistors $R_1$ and $R_2$ connected in series. The anode of the diode $Q_2$ is connected through the current source $CS_2$ to the power supply line $V_{CC}$. The cathode of the diode $Q_2$ is connected to the negative terminal A. The resistor, comprising the resistors $R_1$ and $R_2$ connected in series, is connected in parallel with the diode $Q_2$. The connecting point between the resistors $R_1$ and $R_2$ is connected to the positive terminal B. The diode $Q_2$ is also realized by short circuiting a base and a collector of an NPN transistor. Assume that the forward voltage drop across the diode $Q_2$ is $V_D$. Then the voltage $V_R$ between the terminals A and B is $$V_R = V_D R_2/(R_1+R_2)$$

It should be noted that the voltage $V_R$ is lower than the voltage $V_D$.

The camera CM comprises an automatic shutter-control circuit 4, a switching NPN transistor $Q_8$, a diode $Q_9$, and a current source $CS_3$ which supplies a constant current greater than the reference current $I_0$. The switching transistor $Q_8$ has a collector connected to ground of the automatic shutter-control circuit 4, an emitter connected to ground, and a base connected through the current source $CS_2$ to the power supply line $V_{CC}$. The diode $Q_9$ has an anode connected to the base of the switching transistor $Q_8$ and a cathode connected to the ground. The base of the transistor $Q_8$ is to be connected through a switch SW to the input terminal IN of the input stage ST of the integrated circuit in the strobe light unit.

The operation of the camera will now be described when the camera CM is disconnected from the input stage ST of the integrated circuit in the strobe light unit. In this state, the switch SW is open and the base voltage of the switching transistor $Q_8$ is clamped by the diode $Q_9$ to the voltage $V_D$, provided that the forward voltage drop across the diode $Q_9$ is also $V_D$. Since the base-emitter voltage of the transistor $Q_8$ in its conductive state is substantially equal to $V_D$, the switching transistor $Q_8$ is on. Therefore, the automatic shutter-control circuit 4 is in operation so that the camera CM is in an automatic shutter mode. In this state, the input stage ST is not supplied with an input current.

On the other hand, in the operation of the input stage ST of FIG. 1 when the input stage ST is separated from the Camera CM, the function of clamping the input voltage will first be described with reference to FIG. 2A. Assume that the voltage applied to the input terminal IN is $V_I$, the voltage between the terminals A and B of the reference voltage source $V_{R1}$ is $V_R$, the base-emitter voltages of the transistors $Q_1$ and $Q_3$ are $V_{BE(Q1)}$ and $V_{BE(Q3)}$, respectively, and the anode-cathode voltage of the diode $Q_5$ which is formed by a transistor is $V_{BE(Q5)}$. When the input current $I_I$ is gradually increased, the input voltage $V_I$ is also increased, as shown in FIG. 2A. When the input current $I_I$ reaches a predetermined value $I_X$, the transistors $Q_1$ and $Q_3$ and the diode $Q_5$ are completely turned on so that the input voltage $V_I$ is clamped to a value nearly equal to a constant value $V_c$. The constant value $V_c$ is determined as follows. When the input current $I_I$ is greater than the predetermined value $I_X$, the following expression is obtained with respect to the positive terminal B connected to the base of the transistor $Q_3$:

$$V_I + V_{BE(Q1)} + V_R = V_{BE(Q3)} + V_{BE(Q5)} \quad (1)$$

The base-emitter voltage of each transistor is nearly the same and is nearly equal to 0.7 V at room temperature. Therefore, the following expression (2) can be obtained:

$$V_{BE(Q1)} = V_{BE(Q3)} = V_{BE(Q5)} = V_D \quad (2)$$

Thus, from the above expressions (1) and (2), the input voltage $V_I$ can be expressed as:

$$V_I = V_D - V_R \quad (3)$$

Since $V_D$ and $V_R$ are constant values, the input voltage $V_I$ is clamped to a constant voltage $V_C = V_D - V_R$ when the input current $I_I$ is greater than the predetermined value $I_X$, as illustrated in FIG. 2A. In other words, the transistors $Q_1$, $Q_3$, and $Q_4$ constitute a negative feedback circuit. Therefore, when the input voltage $V_I$ tends to rise above the constant voltage $V_C$, the collector current of the transistor $Q_4$ also increases so that the rise of the input voltage $V_I$ is suppressed. Also, when the input voltage $V_I$ tends to fall below the constant voltage $V_C$, the collector current of the transistor $Q_4$ decreases so that the fall of the input voltage $V_I$ is suppressed.

Now, the function of detecting the input current $I_I$ will be described with reference to FIG. 2B. Since the base-emitter voltage of the transistor $Q_4$ is nearly equal to the anode cathode voltage of the diode $Q_5$, the emitter current of the transistor $Q_4$ is nearly equal to the cathode current of the diode $Q_5$. Since the base current of each transistor is negligible, the input current $I_I$, i.e., the collector current of the transistor $Q_4$, is nearly equal to the emitter current of the transistor $Q_4$. Also, since the base currents of the transistors $Q_4$ and $Q_6$ are negligible, the emitter current $I_3$ of the transistor $Q_3$ is nearly equal to the cathode current of the diode $Q_5$. Accordingly, the expression $I_I = I_3$ is obtained. Similarly, since the base-emitter voltage of the transistor $Q_6$ is equal to the anode-cathode voltage of the diode $Q_5$, the emitter current of the transistor $Q_6$ is equal to the cathode current of the diode $Q_5$ as long as the input current $I_I$ is less than the reference current $I_0$, as will be described later. Because the base currents of the transistors $Q_4$ and $Q_6$ are negligible, the cathode current of the diode $Q_5$ is always equal to its anode current, which is the emitter current $I_3$ of the transistor $Q_3$, and the emitter current of the transistor $Q_6$ is nearly equal to its collector current $I_6$. Therefore, as long as the emitter current $I_3$ is less than the reference current $I_0$, the expression $I_3 = I_6$ can be obtained. As a result, as long as the input current $I_I$ is less than the reference current $I_0$, the following equation is obtained:

$$I_I = I_3 = I_6 \quad (4)$$

The base of the output transistor $Q_7$ receives a current $I_0 - I_6 = I_0 - I_I$ so that the transistor $Q_7$ is in the on state. Therefore, as shown in FIG. 2B, when the input current $I_I$ is less than the reference current $I_0$, the output voltage at the output terminal OUT is at a low level. When the input current $I_I$ is increased so that it is greater than the reference current $I_0$, the output transistor $Q_7$ cannot receive a base current and therefore assumes the off state. Therefore, the output voltage $V_0$ is at a high level equal to the power supply voltage $V_{CC}$. Thus, the current-detecting circuit 2 detects whether or not the input current $I_I$ exceeds the reference current $I_0$ to change the output terminal OUT from a high level potential to a low level potential.

Now, the relation between the camera CM and the strobe light unit will be described. When the strobe light unit is disconnected from the camera, the transistor $Q_8$ in the camera CM is on so that the automatic shutter-control circuit 4 is in an active state. Since the input current $I_I$ is smaller than the reference current $I_0$, the potential at the output terminal OUT is caused to be at a low level. Based on the low level potential at the output terminal OUT, the strobe light unit determines that the strobe light unit is disconnected from the camera.

When the strobe light unit is connected to the camera CM, a current $I_2$ from the current source $CS_3$ in the camera CM is supplied, as the input current $I_I$, to the input terminal IN so that the input voltage $V_I$ is clamped to a value lower than the voltage $V_D$ by the voltage-clamping circuit 1. By this clamping, the transistor $Q_8$ in the camera CM is turned off. Based on the transistor $Q_8$ being off, the camera determines that the camera CM is connected to the strobe light unit. The current-detecting circuit 2 detects that the input current $I_I$, which is equal to $I_2$, is greater than the reference current $I_0$ so as to cause the output terminal OUT to be a high potential level. Based on the high potential level at the output terminal OUT, the strobe light unit determines that the strobe light unit is connected to the camera and that the current $I_2$ is supplied from the camera.

As an alternative to the reference voltage source $V_{R1}$ in the circuit of FIG. 1, any reference voltage source may be possible as long as it provides a reference voltage lower than the base-emitter voltage of a transistor. FIG. 3 is a circuit diagram of a second embodiment of the invention and is an example of a reference voltage source. In FIG. 3, the reference voltage source $V_{R2}$ comprises the constant current source $CS_2$, a resistor R, and an NPN transistor $Q_2$. The collector of the transistor $Q_2$ is connected, through the resistor R and the current source $CS_2$ connected in series with each other, to the power supply line $V_{CC}$. The output of the current source $CS_2$ is connected to the base of the transistor $Q_2$. The emitter and the collector of the transistor $Q_2$ are connected to the negative terminal A and to the positive terminal B, respectively. Assume that the base-emitter voltage of the transistor $Q_2$ is $V_D$. Since the base current is negligible, the reference voltage between the terminals A and B is $V_D - RI_1$. From the expression (3), the clamped input voltage $V_C$ in this case is:

$$V_C = V_D - V_R$$
$$= V_D - (V_D - RI_1) = RI_1$$

Figure 4:
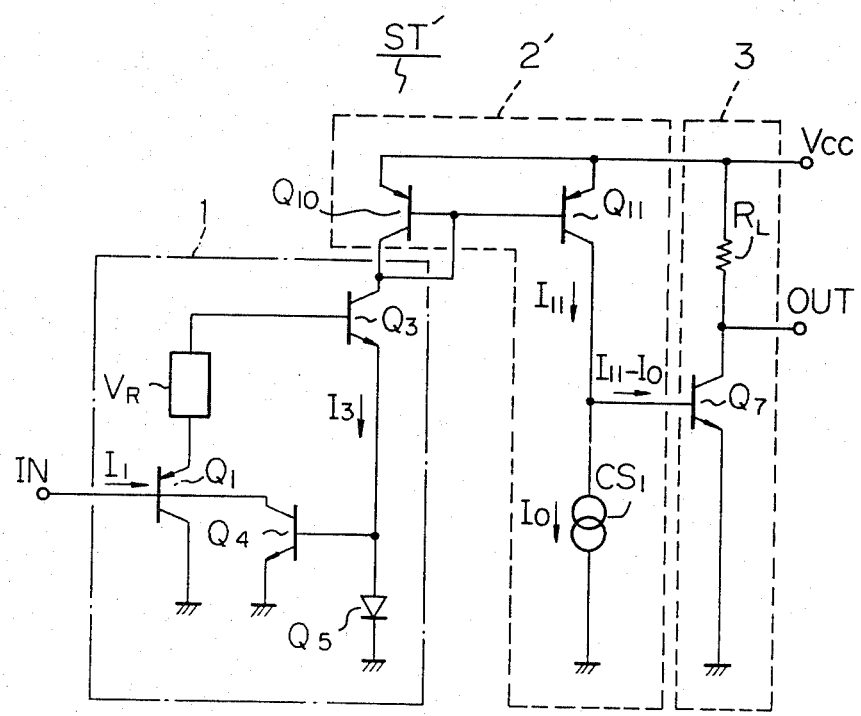

FIG. 4 is a circuit diagram of a third embodiment of the present invention. For the purpose of simplicity, only an input stage of an integrated circuit is shown. The difference between the input stage of FIG. 1 and the input stage of FIG. 4 resides only in the current-detecting circuit. The current-detecting circuit 2' in the circuit of FIG. 4 comprises PNP transistors $Q_{10}$ and $Q_{11}$ and the reference current source $CS_1$ for supplying a constant current $I_0$. The PNP transistor $Q_{10}$ has a base and a collector commonly connected to the collector of the transistor $Q_3$ in the voltage clamping circuit and an emitter connected to the power supply line $V_{CC}$. The PNP transistor $Q_{11}$ has a base connected to the base of the transistor $Q_{10}$, an emitter connected to the power supply line $V_{CC}$, and a collector connected to the base of the output transistor $Q_7$. The reference current source $CS_1$ is connected between the collector of the transistor $Q_{11}$ and ground.

The voltage-clamping circuit 1 and the output circuit 3 are the same as those in the circuit of FIG. 1. In the voltage-clamping circuit 1 of FIG. 4, the reference voltage source is denoted by $V_R$. The reference voltage source $V_R$ may be $V_{R1}$ in the circuit of FIG. 1, $V_{R2}$ in that of FIG. 3, or any other reference voltage source which provides a reference voltage lower than $V_D$.

Since the voltage-clamping circuit 1 of FIG. 4 is the same as that of FIG. 1, the function of clamping the input voltage to a predetermined level in the circuit of FIG. 4 is the same as that of FIG. 1.

The function of detecting the input current in the circuit of FIG. 4 is as follows. Similar to the circuit of FIG. 1, the expression $I_I = I_3$ is obtained. Because the base potentials of the PNP transistors $Q_{10}$ and $Q_{11}$ are equal, $I_3 = I_{11}$ is obtained. Therefore, $I_I = I_{11}$ is obtained. When the input current $I_I$, which is equal to the collector current $I_{11}$ of the transistor $Q_{11}$, is greater than the reference current $I_0$, a current $I_{11} - I_0$ is supplied to the base of the output transistor $Q_7$ so that the transistor $Q_7$ is turned on to provide a low voltage at the output terminal OUT. When the input current $I_I$ is less than the reference current $I_0$, the output transistor $Q_7$ is not supplied with current at its base so that the transistor $Q_7$ is in the off state and provides a high voltage at the output terminal OUT.

FIG. 5 is a circuit diagram of a fourth embodiment of the present invention. In FIG. 5, in place of the current-detecting circuit 2' and the output circuit 3 of FIG. 4, a current-detecting and output circuit 5 is employed. The current-detecting and output circuit 5 comprises the current source $CS_1$ connected between the collector of the transistor $Q_3$ and the power supply line $V_{CC}$ and a PNP transistor $Q_{12}$ having a base connected to the collector of the transistor $Q_3$, an emitter connected to the power supply line $V_{CC}$, and a collector connected to the output terminal OUT.

Because the base current of the transistor $Q_3$ is negligible, the collector current of the transistor $Q_3$ is nearly equal to its emitter current $I_3$. When the current $I_3$, which is equal to the input current $I_I$, is less than the reference current $I_0$, the base current $I_3 - I_0$ is negative so that the transistor $Q_{12}$ is in the off state and provides a low voltage at the output terminal OUT. When the input current $I_I$ is greater than $I_0$, the transistor $Q_{12}$ is in the on state and provides a high voltage at the output terminal OUT. Thus, the current-detecting and output circuit 5 of FIG. 5 detects whether or not the input current $I_I$ exceeds the reference current $I_0$ and, if so, changes the output terminal OUT from a low level potential to a high level potential.

The present invention is not only adapted to a camera system but also to various other integrated circuit systems in which reduced I/0 terminals are required.

From the foregoing description, it will be apparent that, according to the present invention, by providing a relatively simple circuit configuration in an integrated circuit, a single terminal of the integrated circuit can be made to have two functions, i.e., an input voltage-clamping function and an input current-detecting function. Thus, the present invention is very effective for integrated circuits.

We claim:

1. An integrated circuit having an input voltage-clamping function and an input current-detecting function, comprising:

a single input terminal for receiving an input signal having a voltage and an input current;

an output terminal;

a voltage-clamping circuit, operatively connected to said single input terminal, for clamping the voltage at said single input terminal while the input current supplied to said single input terminal is greater than a first predetermined value;

a current-detecting circuit, operatively connected to said voltage-clamping circuit, for detecting whether the input current supplied to said input terminal is greater than a second predetermined value and for generating a detection signal when the input current is greater than the second predetermined value; and an output circuit, operatively connected between said current-detecting circuit and said output terminal, for providing an output signal at said output terminal in response to said detection signal.

2. An integrated circuit as set forth in claim 1, wherein said voltage-clamping circuit comprises:

a first PNP transistor having a base operatively connected to said input terminal, having a collector operatively connected to ground and having an emitter;

a first NPN transistor having a base, having an emitter and having a collector operatively connected to said current detecting circuit, a reference voltage source, having a positive terminal operatively connected to said base of said first NPN transistor and having a negative terminal operatively connected to said emitter of said first PNP transistor, for providing a reference voltage lower than the base-emitter voltage of said first NPN transistor;

a second NPN transistor having a collector operatively connected to said single input terminal, having a base operatively connected to said emitter of said first NPN transistor and having an emitter operatively connected to ground; and a first diode having an anode operatively connected to said emitter of said first NPN transistor, having a cathode operatively connected to ground and having an anode-cathode voltage equal to the base-emitter voltage of said first NPN transistor.

3. An integrated circuit as set forth in claim 2, wherein said reference voltage source has a power supply line and comprises:

a second diode having a cathode operatively connected to said emitter of said first PNP transistor and having an anode;

a first current source operatively connected between the power supply line and the anode of said second diode; and two resistors, operatively connected in series and forming a connecting point therebetween, for forming a single resistor operatively connected in parallel with said second diode, said positive terminal of said reference voltage source being operatively connected to the connecting point between said two resistors.

4. An integrated circuit as set forth in claim 2, operatively connectable to a power supply line, wherein said reference voltage source comprises:

a third NPN transistor having an emitter operatively connected to said negative terminal, having a collector operatively connected to said positive terminal and having a base;

a resistor operatively connected between said collector and base of said third NPN transistor; and a first current source operatively connected between the power supply line and said base of said third NPN transistor.

5. An integrated circuit as set forth in claim 3 or 4, wherein said current-detecting circuit comprises:

a second current source, operatively connected to said output circuit, for supplying a constant current having the second predetermined value; and comparing means, operatively connected to said second current source and said first NPN transistor, for comparing the emitter current of said first NPN transistor with the constant current.

6. An integrated circuit as set forth in claim 5, wherein said comparing means comprises a fourth NPN transistor having a base operatively connected to said base of said second NPN transistor and said emitter of said first NPN transistor, having an emitter operatively connected to ground and having a collector operatively connected to said second current source.

7. An integrated circuit as set forth in claim 5, wherein said comparing means comprises:

a second PNP transistor having an emitter operatively connected to the power supply line and having a base and collector commonly connected to said collector of said first NPN transistor; and a third PNP transistor having an emitter operatively connected to the power supply line, having a base operatively connected to said base of said second PNP transistor, and having a collector operatively connected to said second current source.

8. An integrated circuit as set forth in claim 6, wherein said output circuit comprises:

a load resistor operatively connected to said output terminal and the power supply line; and a fifth NPN transistor having a base operatively connected to said collector of said fourth NPN transistor, having a collector operatively connected to said load resistor and having an emitter operatively connected to ground.

9. An integrated circuit as set forth in claim 7, wherein said output circuit comprises:

a load resistor operatively connected to the power supply line and said output terminal; and a fifth NPN transistor having a base operatively connected to said collector of said third PNP transistor, having a collector operatively connected to said load resistor and having an emitter operatively connected to ground.

10. An integrated circuit as set forth in claim 3 or 4, wherein said current-detecting circuit and said output circuit comprises:

a second current source, operatively connected to said collector of said first NPN transistor and to the power supply line, for supplying a constant current having the second predetermined value; and a fourth PNP transistor having an emitter operatively connected to the power supply line, having a base operatively connected to the collector of said first NPN transistor and having a collector operatively connected to said output terminal.

11. An integrated circuit as set forth in claim 8, wherein said integrated circuit is included in a strobe light unit to be connected to a camera.

12. An integrated circuit as set forth in claim 9, wherein said integrated circuit is included in a strobe light unit to be connected to a camera.

* * * * *

UNITED STATES PATENT AND TRADEMARK OFFICE
CERTIFICATE OF CORRECTION

PATENT NO. : 4,525,637
DATED : JUNE 25, 1985
INVENTOR(S) : YOSHIAKI SANO ET AL.

It is certified that error appears in the above-identified patent and that said Letters Patent is hereby corrected as shown below:

Col. 1, line 65, delete "illustrating".

Col. 2, line 1, delete "illustrating";

line 9, delete "illustrating".

Signed and Sealed this

Twelfth Day of November 1985

[SEAL]

Attest:

DONALD J. QUIGG

*Attesting Officer*     *Commissioner of Patents and Trademarks*